(12) United States Patent
Song et al.

(10) Patent No.: US 9,698,383 B2
(45) Date of Patent: Jul. 4, 2017

(54) ORGANIC LIGHT EMITTING DIODE DISPLAY PANEL AND DISPLAY DEVICE

(71) Applicant: BOE TECHNOLOGY GROUP CO., LTD., Beijing (CN)

(72) Inventors: Yingying Song, Beijing (CN); Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 69 days.

(21) Appl. No.: 14/654,040

(22) PCT Filed: Sep. 29, 2014

(86) PCT No.: PCT/CN2014/087737
§ 371 (c)(1),
(2) Date: Jun. 19, 2015

(87) PCT Pub. No.: WO2015/188524
PCT Pub. Date: Dec. 17, 2015

(65) Prior Publication Data
US 2016/0285049 A1    Sep. 29, 2016

(30) Foreign Application Priority Data

Jun. 11, 2014  (CN) .......................... 2014 1 0259143

(51) Int. Cl.
*H01L 29/08* (2006.01)
*H01L 51/52* (2006.01)
*H01L 27/32* (2006.01)

(52) U.S. Cl.
CPC ...... *H01L 51/5275* (2013.01); *H01L 27/3283* (2013.01); *H01L 51/5284* (2013.01);
(Continued)

(58) Field of Classification Search
CPC .................................................. H01L 51/5275
(Continued)

(56) References Cited

U.S. PATENT DOCUMENTS

2007/0077349 A1* 4/2007 Newman ............... B82Y 20/00
                                                      427/66
2009/0224662 A1   9/2009 Wu
(Continued)

FOREIGN PATENT DOCUMENTS

CN        1717138 A     1/2006
CN      101257747 A     9/2008
(Continued)

OTHER PUBLICATIONS

Office Action dated May 4, 2016 issued in corresponding Chinese Application No. 201410259143.4.
(Continued)

*Primary Examiner* — Ajay K Arora
(74) *Attorney, Agent, or Firm* — Nath, Goldberg & Meyer; Joshua B. Goldberg; Annie J. Kock

(57) ABSTRACT

The present invention provides an organic light emitting diode display panel and a display device, and relates to the field of display technology, which can solve the problem that the display contrast of an existing organic light emitting diode display panel and an existing display device is reduced due to the reflection of ambient light. In the organic light emitting diode display panel and the display device of the present invention, a light gathering unit and a light absorption layer matched with each other are arranged in pixel defining regions, so that the incident ambient light can be gathered by the light gathering unit to the light absorption layer and absorbed by the light absorption layer, to reduce ambient light outgoing from the display panel due to reflection, and increase the contrast of the display panel.

20 Claims, 1 Drawing Sheet

(52) U.S. Cl.
CPC ........ *H01L 27/3246* (2013.01); *H01L 51/524* (2013.01); *H01L 2251/303* (2013.01); *H01L 2251/5315* (2013.01); *H01L 2251/558* (2013.01)

(58) Field of Classification Search
USPC .......................................................... 257/40
See application file for complete search history.

(56) References Cited

U.S. PATENT DOCUMENTS

2010/0045575 A1* 2/2010 Kim .................... H01L 51/5284
                                                                                      345/76
2011/0176304 A1    7/2011 Kim et al.

FOREIGN PATENT DOCUMENTS

| CN | 101288172 A | 10/2008 |
|---|---|---|
| CN | 101533850 A | 9/2009 |
| CN | 101656262 A | 2/2010 |
| CN | 103187434 A | 7/2013 |
| CN | 204067363 U | 12/2014 |

OTHER PUBLICATIONS

International Search Report dated Mar. 13, 2015 issued in corresponding International Application No. PCT/CN2014/087737.

* cited by examiner

ORGANIC LIGHT EMITTING DIODE DISPLAY PANEL AND DISPLAY DEVICE

This is a National Phase Application filed under 35 U.S.C. 371 as a national stage of PCT/CN2014/087737, filed Sep. 29, 2014, an application claiming the benefit of Chinese Application No. 201410259143.4, filed Jun. 11, 2014, the content of each of which is hereby incorporated by reference in its entirety.

FIELD OF THE INVENTION

The present invention relates to the field of display technology, and particularly relates to an organic light emitting diode display panel and a display device.

BACKGROUND OF THE INVENTION

In an organic light emitting diode display device, ambient light can be reflected on the surfaces of a light emitting layer and a metal electrode. When the external background light is strong, part of the reflected light enters the eyes of an observer, so that the contrast of display parts is obviously reduced and the display effect of a display is influenced.

FIG. 1 is a structural schematic diagram of a a top emission display panel of an organic light emitting diode display device in the prior art, including a first substrate 1 and a second substrate 11 which are oppositely arranged; the first substrate 1 includes a plurality of pixel regions 12 and pixel defining regions 13, each of which is located between adjacent pixel regions 12; each of the pixel regions 12 includes an anode 2, an organic light emitting functional layer 14 and a cathode 8 which are successively arranged on the first substrate 1, and the light emitted by the organic light emitting functional layer 14 is sent out from the second substrate 11 (denoted by arrows in FIG. 1); each of the pixel defining regions 13 includes a pixel defining layer 6 arranged on the first substrate 1.

The cathode 8 covers the organic light emitting functional layer 14 and the pixel defining layer 6, and a buffer layer 9 is arranged on the cathode 8, and the buffer layer 9 is in contact with the second substrate 11.

In general, the organic light emitting functional layer 14 includes a first functional layer 3 (generally including a hole injection layer and an electron transport layer) connected with the anode 2, a light emitting layer 4 for emitting light, and a second functional layer 5 (generally including an electron transport layer and an electron injection layer) connected with the cathode.

After entering the second substrate 11, external ambient light can be reflected on the surfaces of the organic light emitting functional layer 14 and the cathode 8. When the external ambient light is strong, part of the reflected light enters the eyes of an observer so that the contrast of display parts is obviously reduced and the display effect of a display is influenced.

In the prior art, a ¼ wavelength polaroid is attached to the surface of the display parts to reduce the reflection on the surfaces of organic light emitting diode devices. By adopting this method, the contrast can be increased, but 60% of emitted light is absorbed or lost by the ¼ wavelength polaroid, and the cost of the polaroid is high.

Secondly, there is also a technology of adding an extinction interference layer to an organic light emitting display device in the prior art, which can also increase the contrast, but a matching relationship between highest occupied molecular orbital energy level and lowest unoccupied molecular orbital energy level of the extinction interference layer and other layer has to be considered.

Thirdly, there is also a technology of adding a light absorption layer to a display device in the prior art, which can reduce reflection of ambient light after entering the interior of the display device, but the light emitted by organic light emitting diode devices is absorbed partially at the same time, so improvement on the contrast of the display device is not obvious.

SUMMARY OF THE INVENTION

An object of the present invention is solving the problem that the display contrast of organic light emitting diode display panel and display device in the prior art is reduced due to reflection of ambient light, and providing organic light emitting diode display panel and display device capable of increasing the contrast.

A technical solution adopted for solving the technical problem of the present invention is the organic light emitting diode display panel, including a first substrate and a second substrate which are oppositely arranged, wherein the first substrate comprises a plurality of pixel regions and pixel defining regions, each of which is located between two adjacent pixel regions; each of the pixel regions includes an anode, an organic light emitting functional layer and a cathode arranged on the first substrate, and each of the pixel defining regions is provided with a pixel defining layer therein; a light absorption layer matched with a position of an end face of the pixel defining layer facing the second substrate, wherein the light absorption layer is used for absorbing irradiation light; and a light gathering unit which is matched with the light absorption layer and used for gathering light incident on the light gathering unit from outside and irradiating the gathered light to the light absorption layer, to allow the light absorption layer to absorb the gathered light.

Preferably, the light gathering unit includes at least one plane convex lens; each plane convex lens comprises a plane part for receiving incident light from outside and a protrusion part for gathering light; the protrusion part faces the light absorption layer; and the plane part is parallel to the plane where the light absorption layer is located.

Preferably, the light gathering unit includes a plurality of plane convex lenses, and the plane convex lenses are uniformly distributed in a region corresponding to a region where the light absorption layer is located.

In some embodiments, the light absorption layer is arranged on a surface of the pixel defining layer facing the second substrate. The cathode covers the organic light emitting functional layer and the light absorption layer. A buffer layer is further arranged on the cathode, and the plane part is in contact with the second substrate, and the protrusion part is located in the buffer layer.

In other embodiments, the cathode covers the organic light emitting functional layer and the end face of the pixel defining layer facing the second substrate. The light absorption layer is arranged on the cathode. A buffer layer is further arranged on the cathode and the light absorption layer, and the plane part is in contact with the second substrate, and the protrusion part is located in the buffer layer.

Preferably, the refractive index of the material of the light gathering unit is larger than the refractive index of the material of the buffer layer.

Preferably, the refractive index of the material of the light gathering unit is within a range of 1.6-2.0, and the refractive index of the material of the buffer layer is within a range of 1.4-1.6.

Preferably, the diameter of the plane part is within a range of 1 μm-5 μm, and the height of the protrusion part is within a range of 5 μm-7 μm.

Preferably, the light absorption layer is made of a black light absorbing material.

Preferably, the black light absorbing material is any one of black epoxy resin, molybdenum oxide, carbon black and titanium suboxide.

Another object of the present invention is providing a display device which includes the organic light emitting diode display panel described above.

In the organic light emitting diode display panel and display device of the present invention, the light absorption layer and the light gathering unit matched with each other are added in the pixel defining regions, and ambient light incident on the light gathering unit is gathered by the light gathering unit to the light absorption layer and absorbed by the light absorption layer, to reduce ambient light outgoing from the organic light emitting diode display panel due to reflection, and increase the contrast of the organic light emitting diode display panel.

DETAILED DESCRIPTION OF THE EMBODIMENTS

To make the person skilled in the art better understand the technical solution of the present invention, the present invention is further described below in detail in conjunction with the accompanying drawings and the specific embodiments.

Embodiment 1

Figure 1:
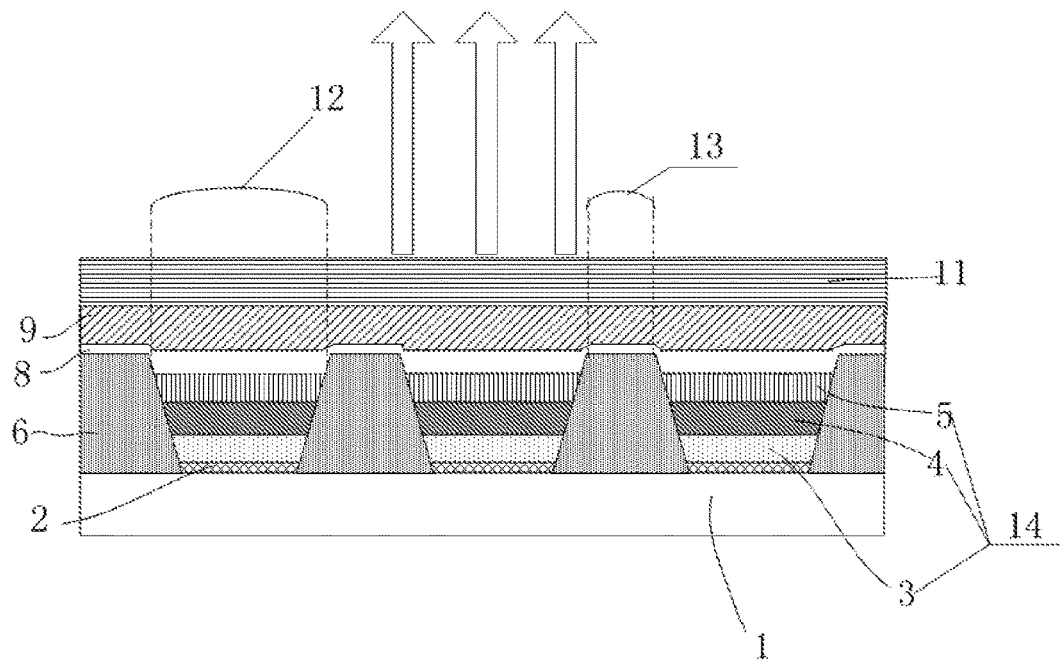
FIG. 1 is a structural schematic diagram of an organic light emitting diode display panel in the prior art.
Figure 2:
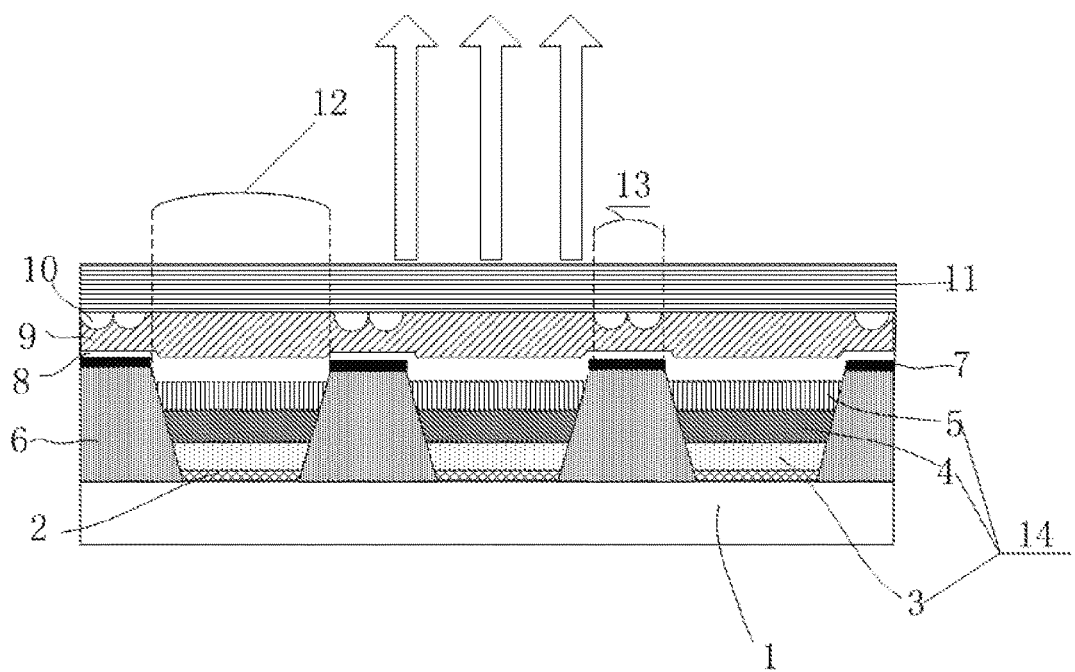
FIG. 2 is a structural schematic diagram of an organic light emitting diode display panel in embodiment 1 of the present invention.

As shown in FIG. 2, the embodiment provides an organic light emitting diode display panel, including a first substrate 1 and a second substrate 11 which are oppositely arranged; the first substrate 1 includes a plurality of pixel regions 12 and pixel defining regions 13, each of which is located between two adjacent pixel regions 12; each of the pixel regions 12 includes an anode 2, an organic light emitting functional layer 14 and a cathode 8 which are successively arranged on the first substrate 1, and the light emitted by the organic light emitting functional layer 14 outgoes from the second substrate 11 (denoted by arrows in FIG. 2); each of the pixel defining regions 13 includes a pixel defining layer 6 arranged on the first substrate 1; the first substrate 1 further includes: a light absorption layer 7 matched with a position of an end face of the pixel defining layer 6 facing the second substrate 11, wherein the light absorption layer 7 is used for absorbing irradiation light; and a light gathering unit 10 which is matched with the light absorption layer 7 and used for gathering light incident on the light gathering unit 10 from outside and irradiating the gathered light to the light absorption layer 7 to allow the light absorption layer to absorb the gathered light.

In the organic light emitting diode display panel of the present invention, the light absorption layer 7 and the light gathering unit 10 matched with each other are added in the pixel defining regions 13, and ambient light incident on the light gathering unit 10 is gathered by the light gathering unit 10 to the light absorption layer 7 and absorbed by the light absorption layer, to reduce ambient light outgoing from the organic light emitting diode display panel due to reflection, and thus increase the contrast of the organic light emitting diode display panel.

Specifically, the light absorption layer 7 is made of a black light absorbing material. For example, the black light absorbing material is any one of black epoxy resin, molybdenum oxide, carbon black and titanium suboxide.

It should be understood that the above black light absorbing material is used for absorbing light, and is not limited to the description in the embodiment. The black light absorbing material can be formed on an end face of the pixel defining layer 6 facing the second substrate 11 by coating or other methods, and a pattern of the corresponding light absorption layer 7 is formed by a patterning process.

The light gathering unit 10 may be, for example, a convex lens, lens array or other structures with light gathering function, and is not defined herein.

Preferably, a projection area of the light absorption layer 7 on the second substrate 11 is equal to a projection area of the end face of the pixel defining layer 6 facing the second substrate 11 on the second substrate 11. As such, the light absorption layer 7 maximally uses the area of the pixel defining layer 6 while not affecting the display of the pixel regions 12.

Preferably, projection areas of the light gathering unit 10 and the light absorption layer 7 on the second substrate 11 are equal. This ensures that the light gathering unit 10 can project the gathered light to the light absorption layer 7, instead of projecting it to the organic light emitting functional layer 14 to cause reflection again.

As shown in FIG. 2, the light gathering unit 10 is a plane convex lens. Preferably, the organic light emitting diode display panel includes a plurality of plane convex lenses, and the plurality of plane convex lenses are uniformly distributed in a region corresponding to a region where the light absorption layer 7 is located, to maximally receive the incident light. Each plane convex lens includes a plane part for receiving incident light from outside and a protrusion part for gathering light; the protrusion part faces the light absorption layer 7; and the plane part is parallel to a plane where the light absorption layer 7 is located.

The plane convex lenses may be formed of acrylic UV curable resin, epoxy UV curable resin or thermosetting resin, etc. The plane convex lens may be directly fabricated on a glass substrate. For example, the light gathering unit 10 may be directly fabricated on the second substrate 11.

As shown in FIG. 2, the light absorption layer 7 is arranged on the end face of the pixel defining layer 6 facing the second substrate 11; and the cathode 8 covers the organic light emitting functional layer 14 and the light absorption layer 7.

A buffer layer 9 is also arranged on the cathode 8, and the protrusion part of the plane convex lens is located in the buffer layer 9, and the plane part of the plane convex lens is in contact with the second substrate 11. The plane convex lenses may also be fabricated on the buffer layer 9.

As shown in FIG. 2, the organic light emitting functional layer 14 includes a first functional layer 3 (generally including a hole injection layer and an electron transport layer) connected with the anode 2, a light emitting layer 4 for emitting light, and a second functional layer 5 (generally including an electron transport layer and an electron injection layer) connected with the cathode 8. The organic light emitting functional layer 14 serves as a light source of the organic light emitting diode display panel.

Specifically, the refractive index of the material of the light gathering unit 10 is larger than the refractive index of the material of the buffer layer 9. This is favorable for ambient light irradiating on the light gathering unit 10 to be all gathered on the light absorption layer 7. For example, the refractive index of the material of the light gathering unit 10 is 1.6-2.0, and the refractive index of the material of the buffer layer is 1.4-1.6.

Preferably, the material of the buffer layer is any one of acrylic resin, epoxy resin and silicon.

Preferably, the diameter of the plane part of the plane convex lens is within a range of 1 μm-5 μm, and the height of the protrusion part is within a range of 5 μm-7 μm. As such, the size of the plane convex lens is matched with a common interval of the pixel regions 12 in the prior art, to gather ambient light to the light absorption layer 7.

The structure described above is a general structure of a top emission organic light emitting diode display panel, and it is also possible to adopt other types of organic light emitting diode display panels.

Preparation methods of the organic light emitting diode display panel of the present invention fall within the prior art, and are not described herein one by one in detail. It needs to be noted that the size of the region where the light gathering unit 10 is located can be adjusted according to the specific intervals of the pixel regions 12, and the specific refractive indices of the material of the light gathering unit and the material of the buffer layer 9, so that the ambient light irradiating the light gathering unit 10 is gathered on the light absorption layer 7 while not affecting the display of the pixel regions 12.

Embodiment 2

The embodiment provides an organic light emitting diode display panel, difference of which from embodiment 1 is in that: the cathode 8 covers the organic light emitting functional layer 14 and the end face of the pixel defining layer 6 facing the second substrate 11; and the light absorption layer 7 is located at a position on the cathode 8 corresponding to the end face of the pixel defining layer 6 facing the second substrate 11.

A buffer layer 9 is also arranged on the cathode 8 and the light absorption layer 7, and the protrusion part of the plane convex lens is located in the buffer layer 9, and the plane part of the plane convex lens is in contact with the second substrate.

Other structures are the same as those in embodiment 1, and are not described herein one by one in detail.

Embodiment 3

The embodiment provides an organic light emitting diode display device including the display panel described above.

It should be understood that the display panel of the present invention is not limited to an organic light emitting diode display panel, and in the case of a liquid crystal display panel, it only needs to arrange corresponding plane convex lenses in regions of the liquid crystal display panel corresponding to the black matrixes.

It should be understood that the above embodiments are only exemplary embodiments for illustrating the principle of the present invention, however, the present invention is not limited thereto. Various modifications and improvements can be made by the person skilled in the art without departing from the spirit and essence of the present invention, and these modifications and improvements should also be considered to be within the protection scope of the present invention.

The invention claimed is:

1. An organic light emitting diode display panel, comprising:
    a first substrate and a second substrate which are oppositely arranged, wherein the first substrate comprises a plurality of pixel regions and pixel defining regions, each of which is located between two adjacent pixel regions; each of the pixel regions includes an anode, an organic light emitting functional layer and a cathode which are arranged on the first substrate, and each of the pixel defining regions is provided with a pixel defining layer therein;
    a light absorption layer matched with a position of an end face of the pixel defining layer facing the second substrate, wherein the light absorption layer is used for absorbing irradiation light; and
    a light gathering unit which is matched with the light absorption layer and only provided at a position corresponding to the end surface of the pixel defining layer facing the second substrate, used for gathering the light incident on the light gathering unit from outside and irradiating the gathered light to the light absorption layer, to allow the light absorption layer to absorb the gathered light and prevent from affecting display of the pixel regions.

2. The display panel according to claim 1, wherein the light gathering unit comprises at least one plane convex lens; each plane convex lens comprises a plane part for receiving incident light from outside and a protrusion part for gathering light; the protrusion part faces the light absorption layer; and the plane part is parallel to a plane where the light absorption layer is located.

3. The display panel according to claim 2, wherein the light gathering unit comprises a plurality of plane convex lenses, and the plane convex lenses are uniformly distributed in a region corresponding to a region where the light absorption layer is located.

4. The display panel according to claim 2, wherein the light absorption layer is arranged on a surface of the pixel defining layer facing the second substrate.

5. The display panel according to claim 3, wherein the light absorption layer is arranged on a surface of the pixel defining layer facing the second substrate.

6. The display panel according to claim 4, wherein the cathode covers the organic light emitting functional layer and the light absorption layer.

7. The display panel according to claim 6, wherein a buffer layer is further arranged on the cathode; and the plane part is in contact with the second substrate, and the protrusion part is located in the buffer layer.

8. The display panel according to claim 2, wherein the cathode covers the organic light emitting functional layer and the end face of the pixel defining layer facing the second substrate.

9. The display panel according to claim 3, wherein the cathode covers the organic light emitting functional layer and the end face of the pixel defining layer facing the second substrate.

10. The display panel according to claim 8, wherein the light absorption layer is arranged on the cathode.

11. The display panel according to claim 10, wherein
a buffer layer is further arranged on the cathode and the light absorption layer; and
the plane part is in contact with the second substrate, and the protrusion part is located in the buffer layer.

12. The display panel according to claim 7, wherein the refractive index of the material of the light gathering unit is larger than the refractive index of the material of the buffer layer.

13. The display panel according to claim 11, wherein the refractive index of the material of the light gathering unit is larger than the refractive index of the material of the buffer layer.

14. The display panel according to claim 12, wherein the refractive index of the material of the light gathering unit is within a range of 1.6-2.0, and the refractive index of the material of the buffer layer is within a range of 1.4-1.6.

15. The display panel according to claim 13, wherein the refractive index of the material of the light gathering unit is within a range of 1.6-2.0, and the refractive index of the material of the buffer layer is within a range of 1.4-1.6.

16. The display panel according to claim 2, wherein the diameter of the plane part is within a range of 1 μm-5 μm, and the height of the protrusion part is within a range of 5 μm-7 μm.

17. The display panel according to claim 3, wherein the diameter of the plane part is within a range of 1 μm-5 μm, and the height of the protrusion part is within a range of 5 μm-7 μm.

18. The display panel according to claim 1, wherein the light absorption layer is made of a black light absorbing material.

19. The display panel according to claim 18, wherein the black light absorbing material is any one of black epoxy resin, molybdenum oxide, carbon black and titanium suboxide.

20. An organic light emitting diode display device, comprising the display panel of claim 1.

* * * * *